US009406365B1

(12) United States Patent
Jeong et al.

(10) Patent No.: US 9,406,365 B1
(45) Date of Patent: Aug. 2, 2016

(54) UNDERLAYERS FOR TEXTURED FILMS OF HEUSLER COMPOUNDS

(71) Applicant: INTERNATIONAL BUSINESS MACHINES CORPORATION, Armonk, NY (US)

(72) Inventors: Jaewoo Jeong, San Jose, CA (US); Stuart S. P. Parkin, San Jose, CA (US); Mahesh G. Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/605,908

(22) Filed: Jan. 26, 2015

(51) Int. Cl.
*H01L 43/10* (2006.01)
*H01L 29/82* (2006.01)
*G11C 11/16* (2006.01)
*H01L 43/02* (2006.01)
*H01L 43/08* (2006.01)

(52) U.S. Cl.
CPC .......... *G11C 11/161* (2013.01); *G11C 11/1673* (2013.01); *H01L 43/02* (2013.01); *H01L 43/08* (2013.01); *H01L 43/10* (2013.01)

(58) Field of Classification Search
CPC ......... H01L 43/00; H01L 43/08; H01L 43/10; H01L 43/12
USPC ................................................. 257/421–427
See application file for complete search history.

(56) References Cited

U.S. PATENT DOCUMENTS

| 6,876,522 | B2 | 4/2005 | Ambrose et al. |
| 6,977,801 | B2 | 12/2005 | Carey et al. |
| 7,268,984 | B2 | 9/2007 | Hasegawa et al. |
| 7,480,122 | B2 | 1/2009 | Ide et al. |
| 7,499,249 | B2 | 3/2009 | Ide et al. |
| 7,554,776 | B2 | 6/2009 | Hasegawa et al. |
| 7,567,413 | B2 | 7/2009 | Ide et al. |
| 7,586,828 | B1 | 9/2009 | Ma |
| 7,598,555 | B1 | 10/2009 | Parkin |
| 9,087,980 | B2 * | 7/2015 | Daibou ................... H01L 43/10 |
| 9,306,155 | B2 * | 4/2016 | Tang ....................... H01L 43/10 |

(Continued)

FOREIGN PATENT DOCUMENTS

| EP | 0897022 A1 | 2/1999 |
| JP | 2009102703 A | 5/2009 |

OTHER PUBLICATIONS

Felser, et al., Spintronics: A Challenge for Materials Science and Solid-State Chemistry. Angew. Chem. Int. Ed. 46, pp. 668-699, (2007).

(Continued)

*Primary Examiner* — Cuong Q Nguyen
(74) *Attorney, Agent, or Firm* — Daniel E. Johnson

(57) ABSTRACT

A structure includes a tetragonal Heusler of the form $Mn_{1+c}X$, in which X includes an element selected from the group consisting of Ge and Ga, with $0 \leq c \leq 3$. The tetragonal Heusler is grown directly on (or more generally, over) a substrate oriented in the direction (001) and of the form $YMn_{1+d}$, wherein Y includes an element selected from the group consisting of Ir and Pt, with $0 \leq d \leq 4$. The tetragonal Heusler and the substrate are in proximity with each other, thereby allowing spin-polarized current to pass from one through the other. This structure may form part of a magnetic tunnel junction magnetoresistive device, and an array of such magnetoresistive devices may together form an MRAM.

18 Claims, 14 Drawing Sheets

(56) References Cited

U.S. PATENT DOCUMENTS

| | | |
|---|---|---|
| 2007/0074317 A1 | 3/2007 | Pakala et al. |
| 2008/0138660 A1 | 6/2008 | Parkin |
| 2008/0268290 A1 | 10/2008 | Carey et al. |
| 2008/0274567 A1 | 11/2008 | Dahmani et al. |
| 2012/0088125 A1 | 4/2012 | Nishiyama et al. |
| 2012/0141837 A1 | 6/2012 | Kurt et al. |
| 2013/0128391 A1 | 5/2013 | Fuji et al. |
| 2014/0139265 A1 | 5/2014 | Manipatruni et al. |
| 2014/0145279 A1 | 5/2014 | Kato et al. |
| 2014/0159177 A1 | 6/2014 | Daibou et al. |

OTHER PUBLICATIONS

Li, et al., Strong dependence of the tetragonal Mn2.1Ga thin film crystallization temperature window on seed layer. Appl. Phys. Lett. 103, 032410, pp. 1-6, (2013).

\* cited by examiner

UNDERLAYERS FOR TEXTURED FILMS OF HEUSLER COMPOUNDS

TECHNICAL FIELD

The invention relates to magnetic tunnel junction magnetoresistive devices, and more particularly, to a magnetic random access memory that employs such devices.

BACKGROUND

A magnetic tunnel junction (MTJ) forms the basic memory element of a non-volatile magnetic random access memory (MRAM) that promises high performance and endurance, and moreover has the potential to be scaled to extremely small sizes. A magnetic tunnel junction (MTJ) is composed of a sandwich of two magnetic layers separated by an ultra-thin insulating layer. One of these layers forms the memory or storage layer, and the other layer forms a reference layer whose magnetic structure is not changed during operation of the MRAM. Electrical current that tunnels between the reference and memory magnetic layers is spin-polarized: The magnitude of the spin-polarization is determined by a combination of the electronic properties of the magnetic electrodes and "spin-filtering" properties of the tunnel barrier. (These magnetic layers are in contact with electrodes; alternatively, these magnetic layers may be viewed as forming part of the electrodes themselves.)

In current-day MRAM the magnetic state of the MTJ is changed by passing a current through it. The current, which is innately spin-polarized, delivers spin angular momentum, so that once a threshold current is exceeded the direction of the memory layer moment is switched. The magnitude of the switching current that is required is less when the magnetization of the electrodes is oriented perpendicular to the layers.

The most promising materials that are being explored for MTJs for dense MRAM include ferromagnetic electrodes formed from alloys of Co, Fe and B, and tunnel barriers formed from MgO (see, for example, U.S. Pat. No. 7,598,555 titled "MgO tunnel barriers and method of formation"). The ferromagnetic electrodes are made of layers sufficiently thin that the magnetizations of these electrodes are oriented perpendicular to these layers. The perpendicular magnetic anisotropy (PMA) of Co—Fe—B layers arises from the interfaces between these layers and the tunnel barrier and/or the underlayer on which the Co—Fe—B layer is deposited. Thus, these layers must be made sufficiently thin that the interface PMA overcomes the demagnetization energy that arises from the magnetic volume and increases in proportion with the magnetic volume of the Co—Fe—B layer. In practice, this means that the PMA is too weak to overcome thermal fluctuations when the device has a critical dimension less than ~20 nm in size, since the thickness of the magnetic layer has to be (i) below that required to maintain its moment perpendicular and (ii) below that needed to switch the magnetic layer with reasonable current densities.

SUMMARY

Materials for use as ferromagnetic electrodes are disclosed which display much larger PMA than that exhibited by Co—Fe—B, with the PMA arising from the volume rather than the interfaces of the electrodes. These compounds, known as Heusler alloys[1], are compounds having the chemical formula $X_2YZ$ or $X'X''YZ$, wherein X and X' and X" and Y are transition metals or lanthanides (rare-earth metals) and Z is from a main group metal. The Heusler compounds have a structure of the type $Cu_2MnAl$ (defined in the Pearson Table), in which the elements are disposed on 4 interpenetrating face-centered cubic (fcc) lattices. Many compounds (~800) are known in this family[2]. Some of these compounds are ferromagnetic or ferrimagnetic due to magnetic moments on the X and/or Y sites. Moreover, while the parent Heusler compounds are cubic and exhibit weak or no significant magnetic anisotropy, the structure of some of these compounds is found to be tetragonally distorted: Due to this distortion the magnetization exhibited by these compounds may be aligned along the tetragonal axis. Thus, thin films formed from such materials may exhibit PMA due to a magneto-crystalline anisotropy associated with the tetragonally distorted structure. Some examples of such tetragonal Heusler compounds are $Mn_{3-x}Ga$ and $Mn_{3-x}Ge$. Thin films of these materials exhibit large PMA but, to date, all work on these materials has involved films that are grown epitaxially on single crystalline substrates such as MgO(100) using seed layers formed from a variety of materials but preferably Cr or Pt[3]. Such single crystalline substrates are not useful for MRAM applications in which the MTJs must be deposited on wires formed from polycrystalline copper, which may be covered with other layers that are also polycrystalline or amorphous.

A preferred embodiment of the invention is a device that includes a tetragonal Heusler of the form $Mn_{1+c}X$, in which X includes an element selected from the group consisting of Ge and Ga, with $0 \leq c \leq 3$. The device also includes a substrate oriented in the direction (001) and of the form $YMn_{1+d}$, in which Y includes an element selected from the group consisting of Ir and Pt, with $0 \leq d \leq 4$. The tetragonal Heusler and the substrate are in proximity with each other, thereby allowing spin-polarized current to pass from one through the other. In a more preferred embodiment X is Ge, Y is Ir, the tetragonal Heusler is of the form $Mn_3Ge$, and the substrate is of the form $IrMn_3$. The magnetization of the Heusler compound is preferably oriented perpendicular to the film plane and has a thickness of between 10 and 500 angstroms.

Another preferred embodiment of the invention is a device that includes a first electrode, a magnetic free layer in contact with the first electrode, a tunnel barrier underlying the free magnetic layer, and a magnetic reference layer underlying the tunnel barrier, in which the magnetic reference layer includes a tetragonal Heusler of the form $Mn_{1+c}X$, X includes an element selected from the group consisting of Ge and Ga, and $0 \leq c \leq 3$. The device also includes a second electrode underlying the magnetic reference layer, with the second electrode including a substrate oriented in the direction (001) and of the form $YMn_{1+d}$, in which Y includes an element selected from the group consisting of Ir and Pt, and $0 \leq d \leq 4$. Current that passes through the first electrode and the second electrode passes through the magnetic free layer, the tunnel barrier, and the magnetic reference layer.

One implementation of the invention is a method of using the device just described, in which voltage is applied across the first electrode and the second electrode, thereby inducing current to flow through the magnetic layers and the tunnel barrier. As a result, the orientation of the free magnetic layer may be changed due to spin transfer torque from the current. The device may be one of a plurality of magnetic tunnel junction devices that together form an MRAM, with each of the tunnel junction devices including a free layer having a respective orientation. Information may be read out of the MRAM by detecting the orientation of the free layers.

BRIEF DESCRIPTION OF THE DRAWINGS

FIG. 4 (which includes FIGS. 4A, 4B, 4C, and 4D). Characteristics of Mn$_3$Ge-based magnetic tunnel junction FIG. 4A MgO thickness dependence of R$_{AP}$A product (solid symbols) and TMR (open symbols). Si/SiO$_2$/TaN/IrMn$_3$, Si/SiO$_2$/TaN/IrMn$_3$/TaN, MgO(100)/Cr seed layers are compared. Solid line and dashed lines are guides to the eye for R$_{AP}$A product and TMR, respectively.

FIG. 4C 2-terminal junction resistance versus magnetic field applied perpendicular to the device measured at 300K (smaller squares) and 3K (bigger squares). TMR of junctions with (solid squares) and without (open squares) TaN diffusion barrier are compared. For MTJs with TaN diffusion barriers, two sets of data were measured at 3K (solid bigger squares) after cooling down the device from 300 K in a field of +9T and a field of −9T, respectively. These data are mirror images of each other, as can be seen in the figure.

DETAILED DESCRIPTION

Figure 1A:
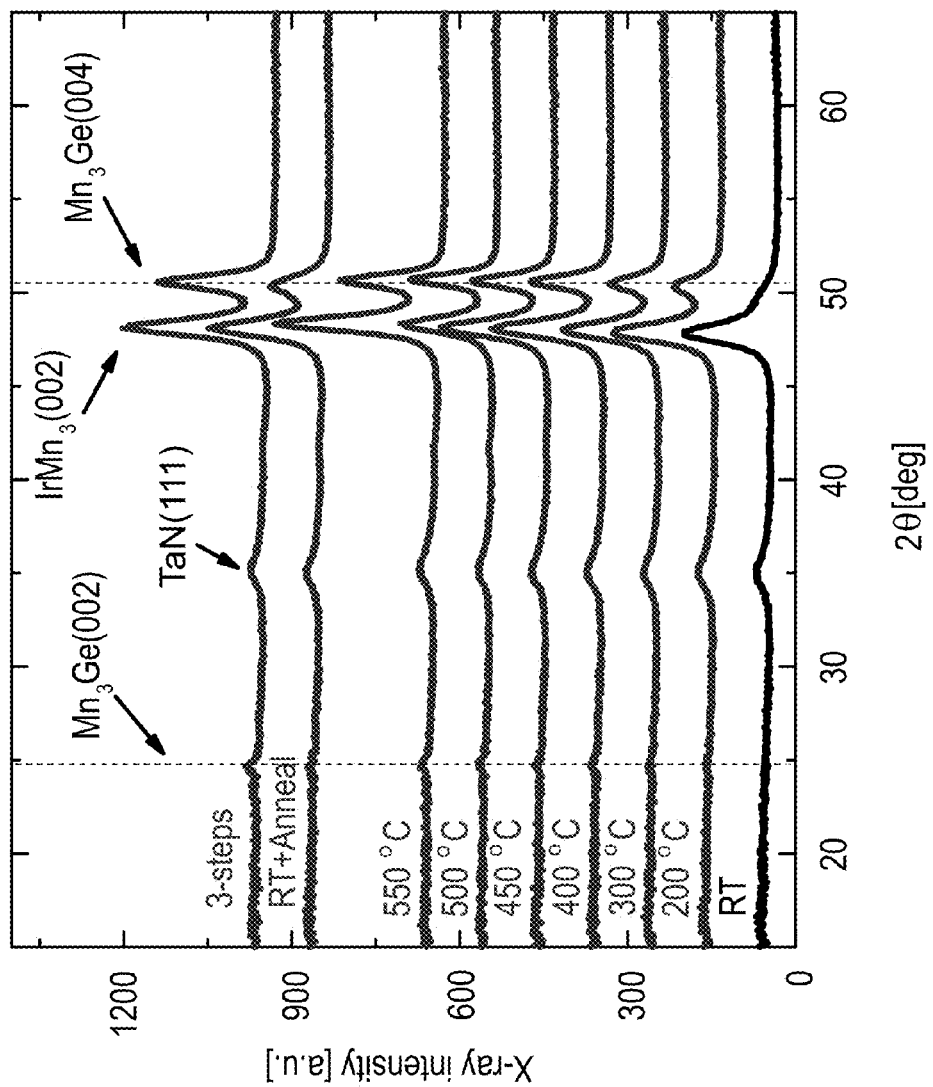
FIG. 1 (which includes FIGS. 1A and 1B). $Mn_3Ge$ Heusler films: structural and topographical properties FIG. 1A X-ray diffraction θ-2θ patterns of 300 Å thick Mn$_3$Ge films deposited at various temperatures on Si(001)/SiO$_2$ substrates on which were first deposited TaN/IrMn$_3$ films. The Mn$_3$Ge layers were capped with 30 Å thick Ta layers. For comparison the upper two curves correspond to data taken on films that were: (i) deposited at room temperature (RT) followed by an in-situ anneal and (ii) prepared using a 3-step process. Data for these samples are also included in FIG. 1B.
FIG. 1B Deposition temperature dependence of (top-panel) crystal structure ordering (extrapolated from FIG. 1A) and (bottom-panel) root mean square (RMS) surface roughness measured by atomic force microscopy (AFM). The top panel shows the ratio of the measured intensities of the Mn$_3$Ge (002) to the Mn$_3$Ge (004) peaks for three different deposition methods.

Films of the Heusler compound Mn$_{3-x}$Ge, along with other layers, were grown over Si(100) substrates covered with 250 Å of amorphous SiO$_2$, by ion-beam deposition (IBD) or by dc-magnetron sputtering in an ultra-high vacuum (UHV) chamber with a base pressure of ~2×10$^{-9}$ Torr. For MTJs for MRAM applications, the magnetization of the film should exhibit a well-defined magnetization versus perpendicular magnetic field hysteresis loop which is square (remanent magnetization is equal to or nearly equal to the saturation magnetization of the film in large magnetic fields), in which the magnetization switches abruptly from one direction perpendicular to the film plane to the opposite direction at a well-defined coercive field (the field where the magnetization of the film is zero). Also, when the magnetic field is applied in a direction in the plane of the film, the magnetization in the direction of the applied field should increase from approximately zero to the value of the saturation magnetization approximately linearly. When films of Mn$_{3-x}$Ge are directly deposited on a surface of amorphous SiO$_2$, the films are found to exhibit no well-defined crystalline texture and, for this reason, the magnetization of the films is not well oriented perpendicular to the film plane so that the magnetization versus perpendicular applied magnetic field is not square as required for optimum performance.

For some materials even highly textured films can be formed by depositing these materials on appropriate underlayers that are properly prepared. For example, typically fcc materials such as Cu or Pt will preferentially be textured with (111) crystal planes parallel to the surface of the film, whereas body centered cubic materials will tend to grow with (110) crystal planes parallel to the surface of the film. However, such metals as Cu and Pt grown on oxide surfaces are often very rough because these metals may not "wet" the oxide surface. Thus, to minimize their surface energy they may grow initially in the form of disconnected islands that may eventually coalesce to form a continuous thin film when the film is made sufficiently thick.

In a preferred embodiment of the invention, highly textured (001) oriented films of Mn$_{1+c}$Ge or Mn$_{1+c}$Ga, in which for each case 0≤c≤3 (or in the case of the Ge compound, 1≤c≤3 is even more preferred) are prepared by using underlayers that are themselves highly textured when deposited on an amorphous layer of SiO$_2$. Underlayers that have this property include TaN/IrMn$_3$ and TaN/IrMn$_3$/TaN. IrMn$_3$ films that are deposited on TaN seed layers on amorphous SiO$_2$ are highly textured with the (001) axis perpendicular to the plane of the IrMn$_3$ film. (Similar results would be expected using Pt instead of Ir.) Without the TaN seed layer, the IrMn$_3$ layers are poorly textured with grains in the film that are oriented with (111) planes or (001) or (110) planes parallel to the substrate. The (001) orientation of the grains within the polycrystalline IrMn$_3$ layer is needed to promote the growth of (001) oriented Mn$_3$Ge layers, in which the tetragonal axis is perpendicular to the plane of the Mn$_3$Ge layer. Although the lattice mismatch between IrMn$_3$ and Mn$_3$Ge is small (<1%), these same underlayers of TaN/IrMn$_3$ (and equivalently TaN/IrMn$_3$/TaN) are found to promote the growth of a wide range of both cubic and tetragonal Heuslers that have larger lattice mismatches. (Even lattice mismatch as high as ~7% is estimated by assuming epitaxial 45° in-plane rotated growth of Heusler compound on IrMn$_3$, i.e., $<110>_{Heusler}//<100>_{IrMn3}$ in L2$_1$ unit cell for Heusler and L1$_2$ unit cell for IrMn$_3$.) These compounds include Co$_2$MnSi, Co$_2$MnGe, Ni$_2$MnGe, Fe$_2$CuSn, Fe$_2$CuSb, Mn$_3$Ga, Mn$_2$NiSb, Mn$_2$CuSb Co$_2$RhSb, and Rh$_2$CoSb. Thin films of these Heusler compounds were grown on TaN/IrMn$_3$ and TaN/IrMn$_3$/TaN underlayers and were found, in each case, to exhibit well defined (001) crystallographic textures due to the properties of the underlayers.

Data of an example of the structure that realizes a highly textured Mn$_3$Ge film are shown in FIG. 1. Seed layers of TaN that are 200 Å thick are first deposited on a Si(100)/SiO$_2$ substrate by reactive dc magnetron sputtering at ambient temperature. IrMn$_3$ underlayers that are 100 Å-200 Å thick are subsequently deposited at ambient temperature by dc-magnetron sputtering. These layers may also be deposited by ion-beam deposition (IBD). For magnetron sputtering a sputter gas pressure of 3 mTorr was used; TaN was grown using a sputter gas mixture of argon and nitrogen. The composition of the TaN film, i.e., Ta$_{1-x}$N$_x$, was sensitive to the composition of the sputter gas: A preferred composition of 90% Ar and 10% N2 (by flow of gas into the chamber) was used to obtain films with a composition close to Ta$_{50}$N$_{50}$.

A series of studies was carried out to determine optimal conditions for preparing films composed of the Mn$_3$Ge compound, as shown in FIG. 1A. (Data analogous to those shown in FIG. 1A were recorded for Mn$_2$Ga, which are not shown, but which were similar in appearance.) In one set of experiments, Mn$_3$Ge films, each 300 Å thick, were deposited on Si(100)/SiO$_2$/200 Å TaN/200 Å IrMn$_3$ at seven different deposition temperatures ($T_D$ or $T_{growth}$), which varied from room temperature (RT) to 550° C. but without a subsequent annealing step (see the bottom seven curves in FIG. 1A). The roughness of these films depends on $T_D$ (see the curves in FIG. 1B labeled "no anneal"). Rough films (root mean square (RMS) roughness >5 Å) were obtained for $T_D$ greater than 200° C., with the RMS roughness increasing monotonically with increasing $T_D$. For use as magnetic electrodes in MTJs for MRAM applications, the tunnel barriers are preferably very thin in the range of ~1-2 nm, and consequently, the magnetic electrodes are ideally very smooth. At the same time, for optimal magnetic properties of the Heusler compound, the Mn and Ge atoms must be well-ordered atomically on the respective atomic sites in the unit cell of the Heusler compound. To obtain smooth films, $T_D$ must be kept as low as possible but to achieve chemically ordered Heusler compounds $T_D$ must be maintained preferably as high as possible. At the same time there is a limitation on the maximum value of $T_D$ which is determined by the temperature above which diffusion of elements from the underlayers into the Mn$_3$Ge layer becomes significant. A second, alternative method of forming the Mn$_3$Ge layer involves depositing the layer at ambient temperature or a sufficiently low deposition temperature (e.g., <200° C.) and then subsequently annealing the structure at an elevated temperature (see the curve in FIG. 1A labeled "RT+anneal").

Figure 1B:
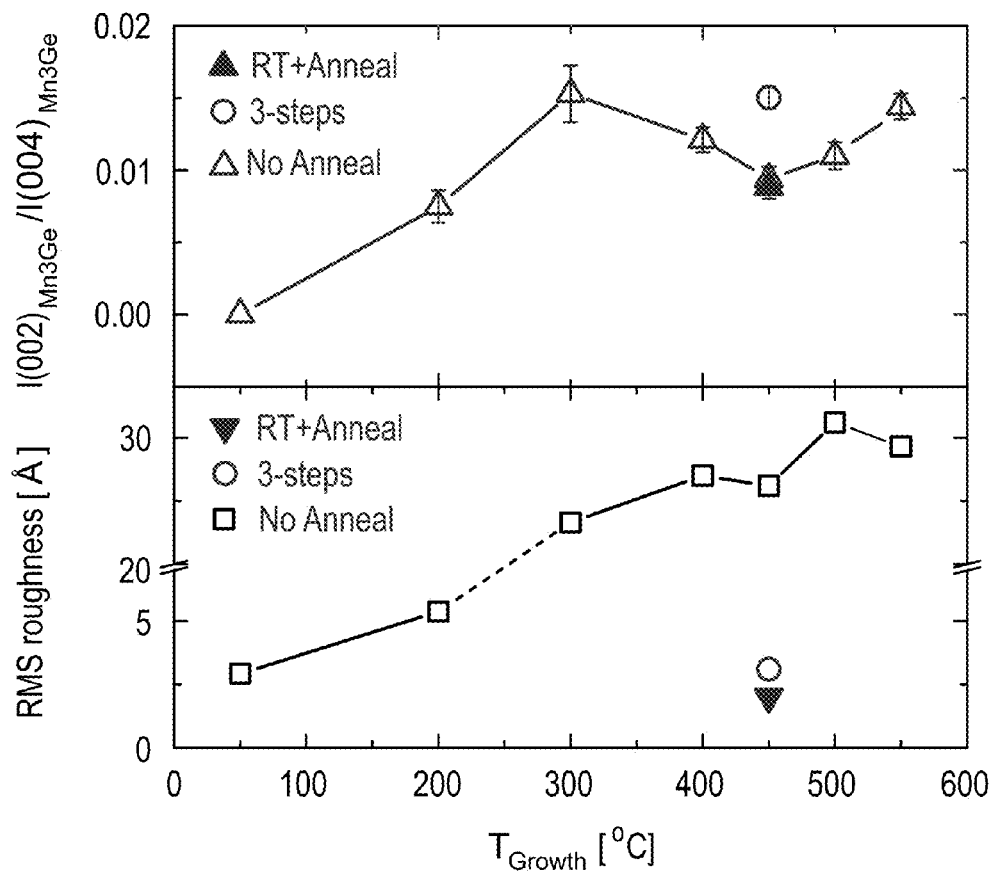
Figure 2A:
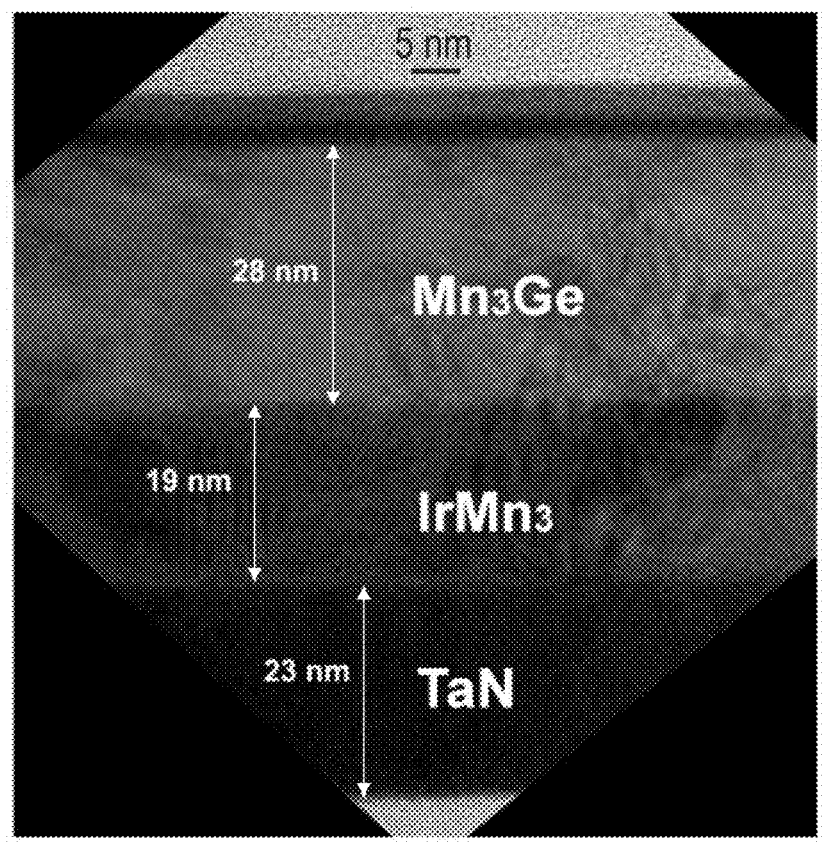
(FIG. 2A) Si/250 Å SiO$_2$/200 Å TaN/200 Å IrMn$_3$/300 Å Mn$_3$Ge (RT+450C Anneal)/30 Å Ta, and (FIG. 2C) Si/250 Å SiO$_2$/200 Å TaN/200 Å IrMn$_3$/20 Å TaN/300 Å Mn$_3$Ge (3-steps process)/20 Å rf-MgO/12 Å Co$_{20}$Fe$_{60}$B$_{20}$/50 Å Ta/50 Å Ru. EELS data are shown in FIG. 2B and FIG. 2D, which were taken for the samples in FIG. 2A and FIG. 2C, respectively. (In each case, the data were collected over the region indicated by the box in the image and in the direction indicated by the arrow within that box.) Data are shown for the concentration of Ta, N, Mn, Ir, and Ge versus the thickness of the film. These data show clear differences for Ir and Ge interdiffusion. No sign of interdiffusion was found when a TaN diffusion barrier was deposited between the IrMn$_3$ and Mn$_3$Ge layers.
Figure 2B:
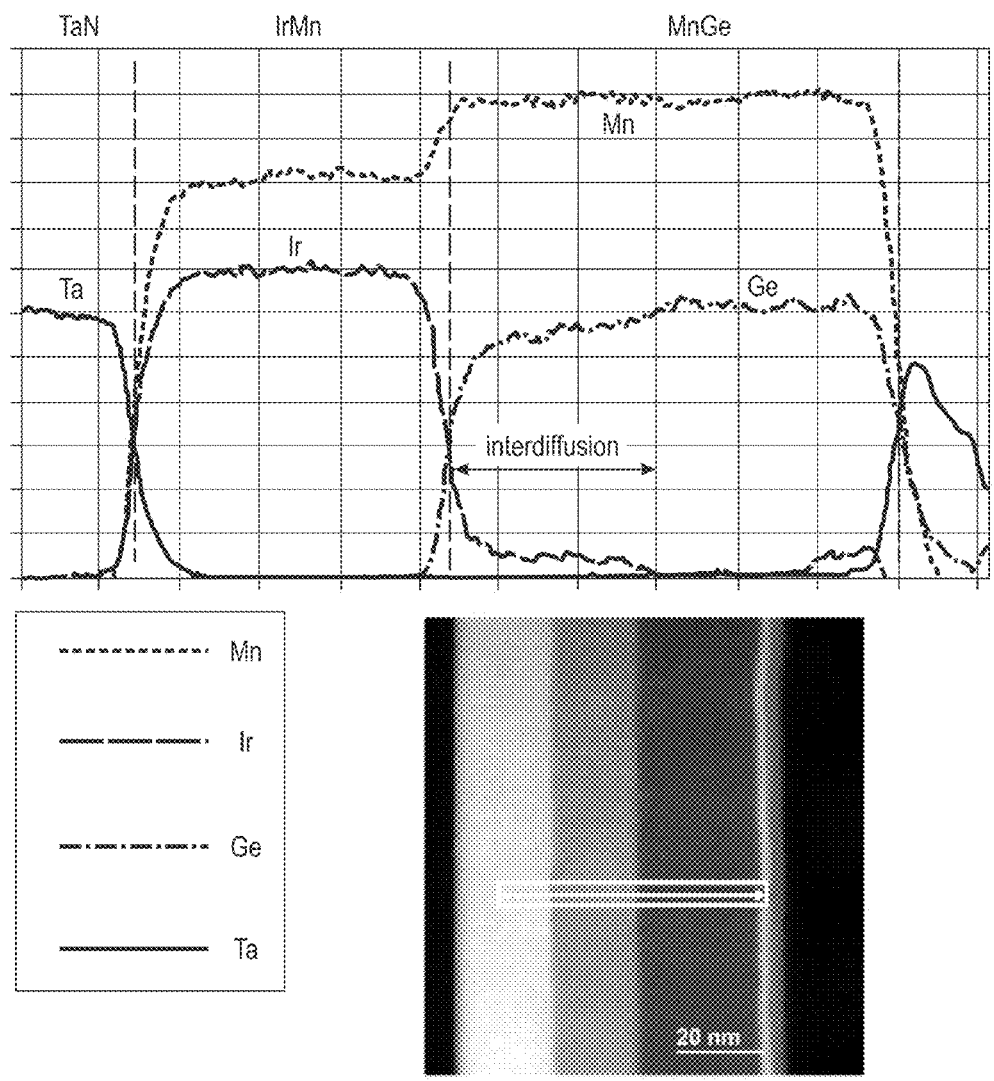
FIG. 2 (which includes FIGS. 2A, 2B, 2C, and 2D). High-resolution transmission electron microscopy (HRTEM) image and electron energy loss spectroscopy (EELS) for Mn$_3$Ge films, with and without TaN diffusion barriers HRTEM images of films with the structure.
Figure 2C:
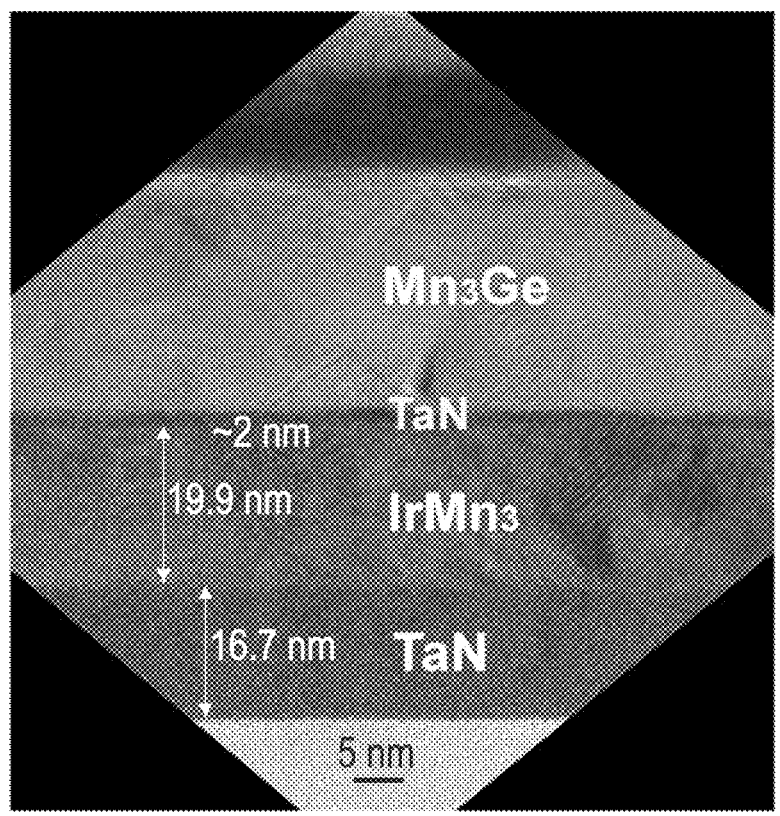
Figure 2D:
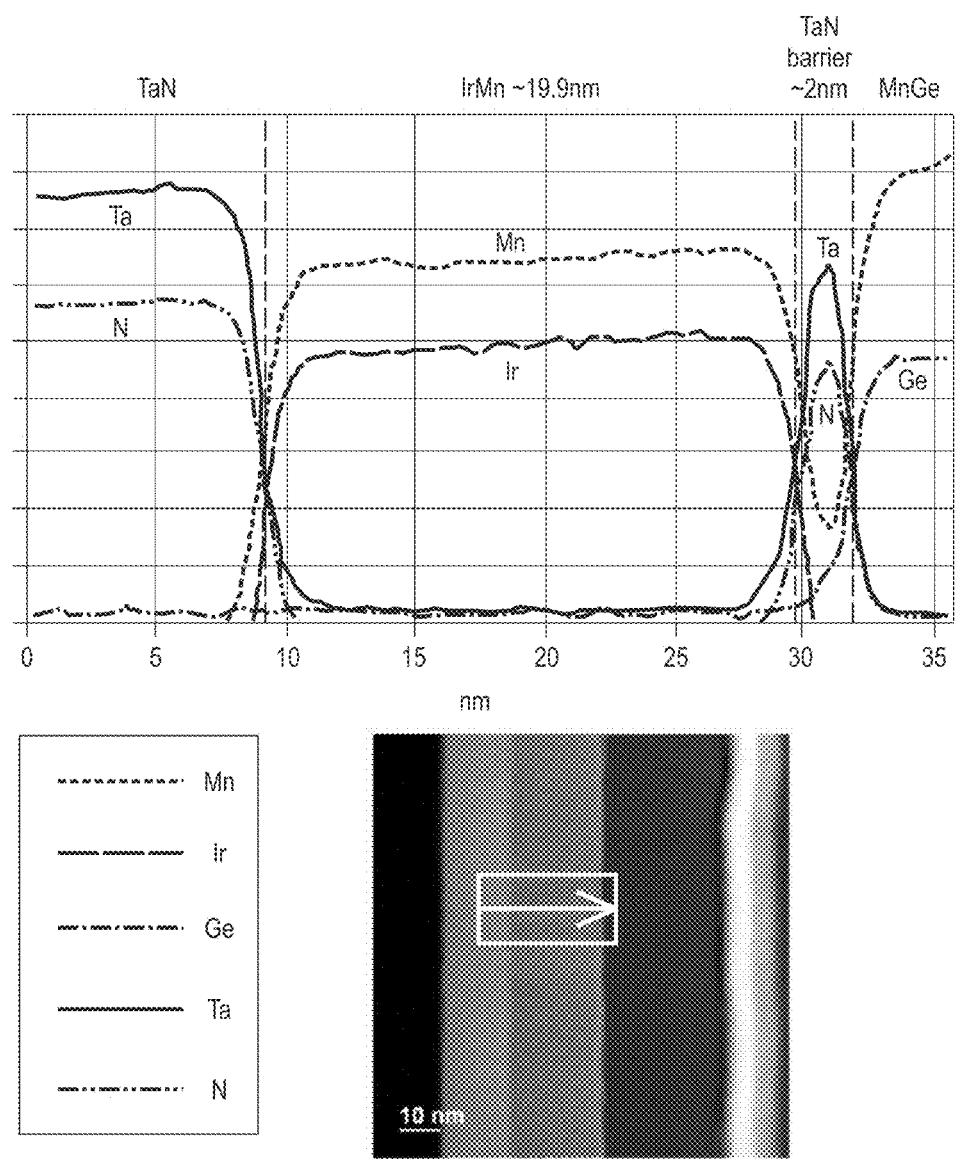

A third method combines aspects of these two methods in which the Mn$_3$Ge films are grown using a 3-step process (see the curve in FIG. 1A labeled "3 steps"). First, a seed layer formed from Mn$_3$Ge is grown at a high temperature, for example, a layer 20 Å thick is deposited at 450° C. Second, a Mn$_3$Ge layer is deposited at a lower temperature. The thickness of the combination of the seed layer and the second Mn$_3$Ge layer equals the desired thickness. For example, a layer formed from 280 Å Mn$_3$Ge is deposited at 150° C. Third, the deposited structure is annealed in-situ: for example, at 450° C. for 1 hour in the deposition chamber in ultra-high vacuum. The films grown by this 3-step process had significantly lower RMS roughness (~3 Å) while having chemical ordering comparable to the films grown directly at 450° C. (As indicated in FIG. 1B, the chemical ordering between the MnMn and MnGe planes in a D0$_{22}$-Mn$_3$Ge structure is directly correlated with the intensity ratio of the x-ray diffraction peaks I(002)/I(004); Mn$_3$Ge and higher chemical ordering implies improved magnetic properties, such as higher spin polarization of electrons flowing through the Mn$_3$Ge electrode.) This is shown in FIG. 1B, which compares RMS roughness of the three methods just described.

During the annealing step, there may be substantial interdiffusion between the IrMn$_3$ and Mn$_3$Ge layers, as shown in FIG. 2. This may result in deterioration of the magnetic properties of the Mn$_3$Ge layer. For example, the magnetic moment of the Mn$_3$Ge film may be substantially reduced. Using the conditions mentioned above, Mn$_3$Ge films with thicknesses of up to ~100 Å display almost zero magnetic moment. To reduce the interdiffusion of elements between the underlayers and the Mn$_3$Ge layer and the consequent degradation of properties of the Mn$_3$Ge layers, a thin TaN layer may be deposited on top of the IrMn$_3$ layer before the Mn$_3$Ge layer is deposited. A TaN layer as thin as 20 Å or even 10 Å is sufficient to considerably limit interdiffusion. Electron energy loss spectroscopy (EELS) studies carried out in a transmission electron microscope on cross-sectional samples of TaN/IrMn$_3$/Mn$_3$Ge (see FIG. 2B) and TaN/IrMn$_3$/TaN/Mn$_3$Ge (see FIG. 2D) thin film structures show that, in the first case, there is substantial diffusion of Ir into the Mn$_3$Ge layer whereas in the second case, there is no evidence of Ir diffusion into the Mn$_3$Ge layer (see FIGS. 2B and 2D). FIGS. 2A and 2C are high resolution cross sectional TEM images of the structures corresponding to the data shown in FIGS. 2B and 2D, respectively.

The magnetic properties of samples of TaN/IrMn$_3$/Mn$_3$Ge and TaN/IrMn$_3$/TaN/Mn$_3$Ge are compared in FIG. 3 for several thicknesses of the Mn$_3$Ge layers. FIG. 3A shows in-plane (open squares) and out-of-plane (solid line) magnetic hysteresis loops measured using a SQUID-VSM for Mn$_3$Ge films grown on Si(001)/SiO$_2$ substrates, with and without 20 Å of TaN. Mn$_3$Ge films deposited on the TaN diffusion barrier show a magnetization that increases with film thickness. The bottom-right panel in FIG. 3A corresponds to the lower part of the full MTJ structure shown in FIG. 3D without the upper free layer structure above Mn$_3$Ge (i.e., instead of MgO/CoFeB/Ta/Ru, a 30 Å Ta capping layer was deposited on Mn$_3$Ge), whereas the other five panels in FIG. 3A correspond to the lower part of structure shown in FIG. 3B (once again, instead of MgO/CoFeB/Ta/Ru, a 30 Å Ta capping layer was deposited on Mn$_3$Ge). In FIG. 3B, which shows a preferred embodiment of the present invention, Ta/Ru could form part of a top electrode, and TaN/IrMn$_3$ could form part of a bottom electrode. The magnetic free layer and the magnetic reference layer are represented by the structures CoFeB and Mn$_3$Ge, respectively, whereas the tunnel barrier is MgO. The additional layer of TaN below the magnetic reference layer Mn$_3$Ge is an optional diffusion barrier. In an MRAM device, the orientations of the free layers in an array of MTJ structures (e.g., see the exemplary structure of FIG. 3B) represents data (information) that may be written into the MTJ structures and/or read out of them (by detecting the orientations of the free layers).

Figure 3A:
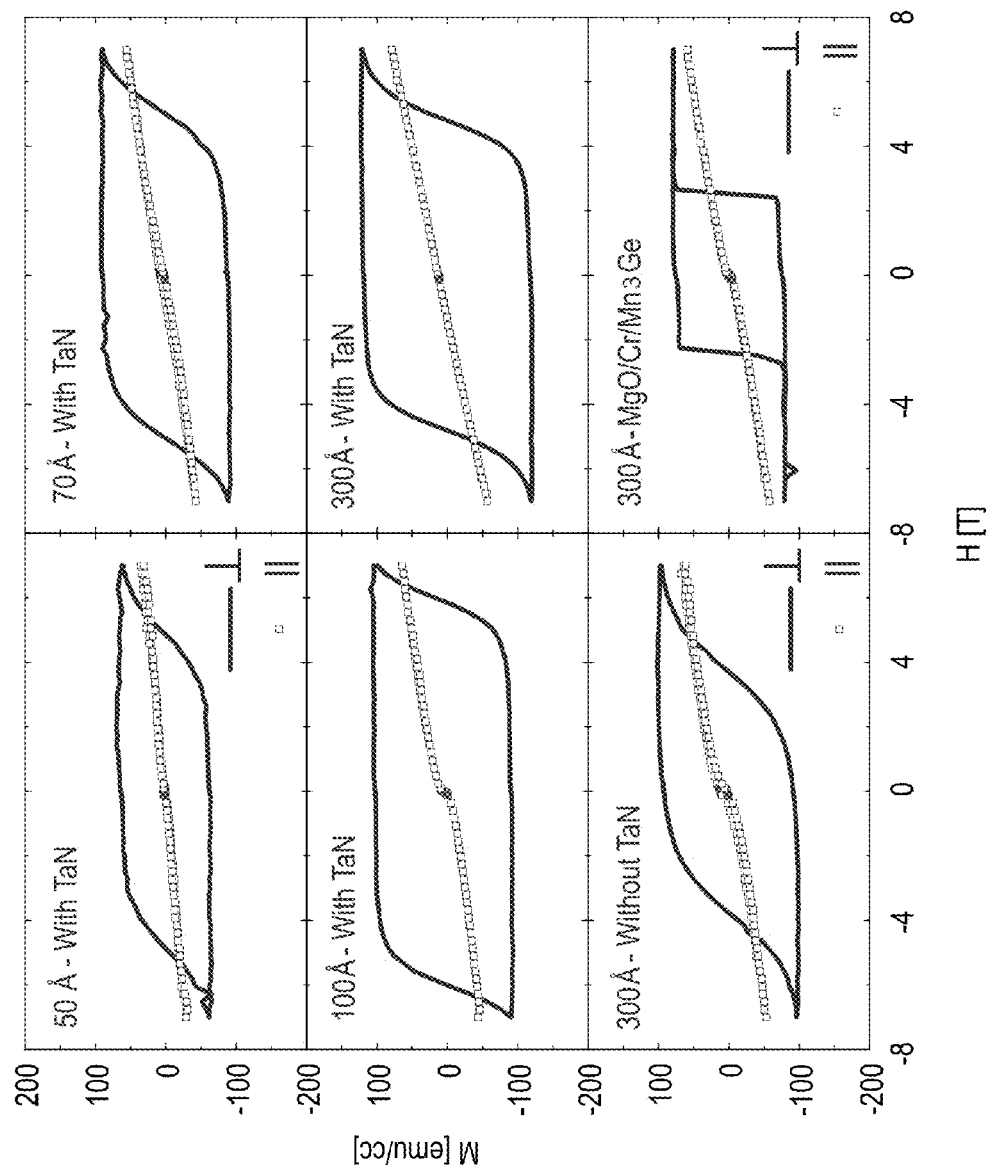
FIG. 3 (which includes FIGS. 3A, 3B, 3C, and 3D). Mn$_3$Ge Heusler films with giant perpendicular magnetic anisotropy FIG. 3A Magnetization versus magnetic field hysteresis loops of Mn$_3$Ge films grown on different underlayers/substrates. Open squares pertain to measurements with applied magnetic field aligned parallel to the film plane. The top four panels refer to samples with the following structures: Si(001)/SiO$_2$/200 Å TaN/200 Å IrMn$_3$/10 Å TaN/x Å Mn$_3$Ge (3-step)/30 Å Ta, with x=50 Å, 70 Å, 100 Å and 300 Å. Solid lines denote out-of-plane loops. The bottom-left panel refers to Mn$_3$Ge film grown without a 10 Å TaN diffusion barrier, while the bottom-right panel refers to Mn$_3$Ge film deposited on a MgO/Cr-buffered MgO(001) single crystal substrate. Measurements are carried out at ambient temperature.
FIG. 3C Top panel—magnetic moment per unit area m extrapolated from the data in FIG. 3A. The solid line indicates the predicted bulk areal moment of D0$_{22}$-Mn$_3$Ge. Bottom panel—coercive field H$_C$ (left axis, full triangles) and uniaxial anisotropy constant K$_U$ (right axis, empty squares). In order to determine the uniaxial anisotropy constant from the relation $K_U = H_{eff} M_S/2 + 2\pi M_S^2$, $H_{eff}$ is usually evaluated from the M vs. H hard-axis loop at the magnetic field at which the magnetization reaches saturation. As is noticeable in FIG. 3A (open squares), the magnetization is expected to saturate at high magnetic fields values, not accessible by the measurement tool; thus, H$_{eff}$ was assumed (as a lower bound) to be 7T.
FIGS. 3B and 3D Schematic diagrams of the nominal structure of films grown on a Si(001)/SiO$_2$ substrate (FIG. 3B) and a MgO(001) single crystal substrate (FIG. 3D). To investigate the structure, topography, and magnetic properties of these films, 30 Å Ta (not shown in the figures) was used in each case as a capping layer.
Figure 3B:
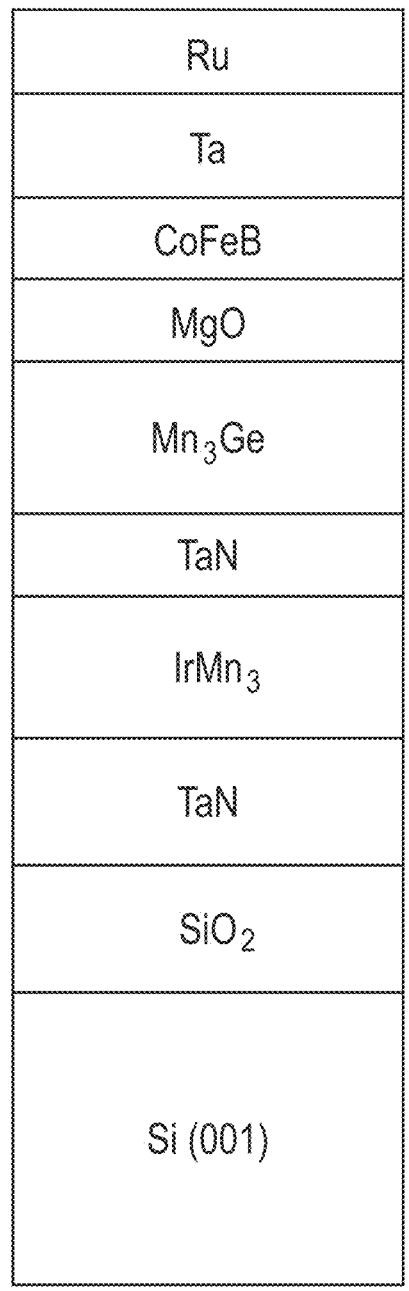

Magnetic hysteresis loops of 300 Å thick Mn$_3$Ge film grown on MgO/Cr-buffered MgO(001) single crystal substrate are illustrated in the right-bottom panel of FIG. 3A; this film was grown in order to compare the quality between Mn$_3$Ge films grown onto amorphous and single crystal substrates. All Mn$_3$Ge films display very strong PMA, although the anisotropy is substantially lower when they are grown on MgO/Cr-buffered single crystal MgO(001), presumably due to the lattice mismatch between Cr and the Heusler alloy. In contrast, the IrMn$_3$ buffer-layer allows a 'strain-free' growth of Mn$_3$Ge, giving rise to a giant PMA, with values of coercive fields H$_C$ up to 6T, as shown with the full triangles in the bottom panel of FIG. 3C (for a TaN/IrMn$_3$/TaN/Mn$_3$Ge structure). Magnetic moment per unit area m as a function of Mn$_3$Ge thickness is estimated from the magnetization vs. field loops and illustrated in the top panel of FIG. 3C. Here, the solid straight line refers to the calculated value of bulk D0$_{22}$-Mn$_3$Ge: The experimental values for Mn$_3$Ge films grown on Si/SiO$_2$ substrates with the TaN diffusion barrier (top panel of FIG. 3C, circles connected by dashed line) follow the theoretical trend; however, compared to these values, m is only ~80% and ~65% of the theoretical value for films without the TaN barrier and those grown on MgO(001) single crystal substrates (see also top panel of FIG. 3C). Even in the case of Mn$_2$Ga, large PMA values were observed using a TaN/IrMn$_3$/Mn$_2$Ga structure.

Figure 3C:
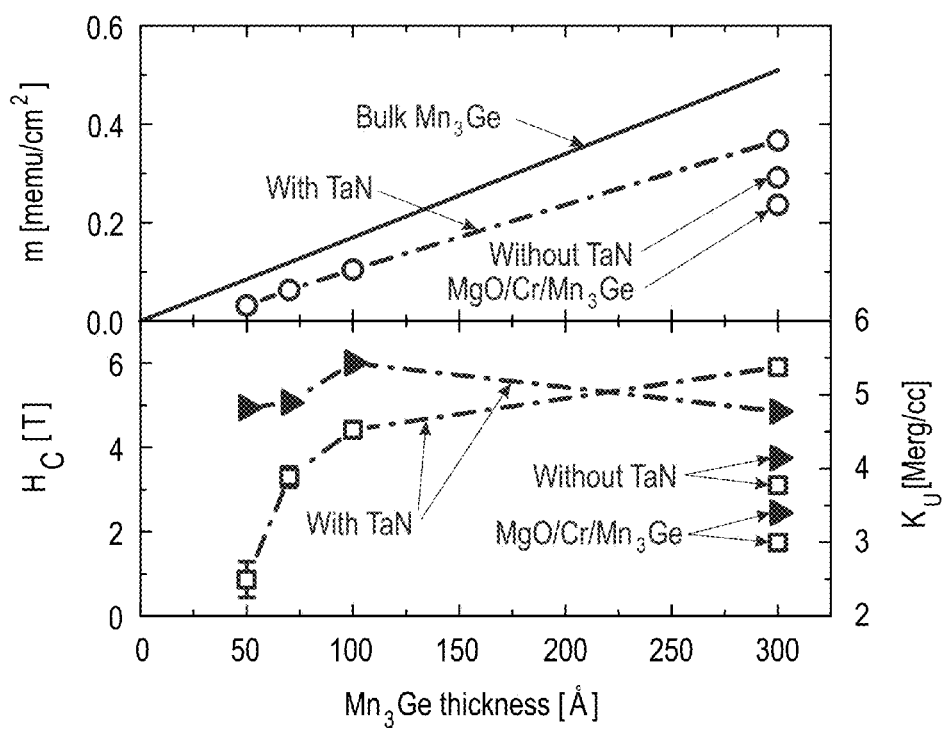
Figure 3D:
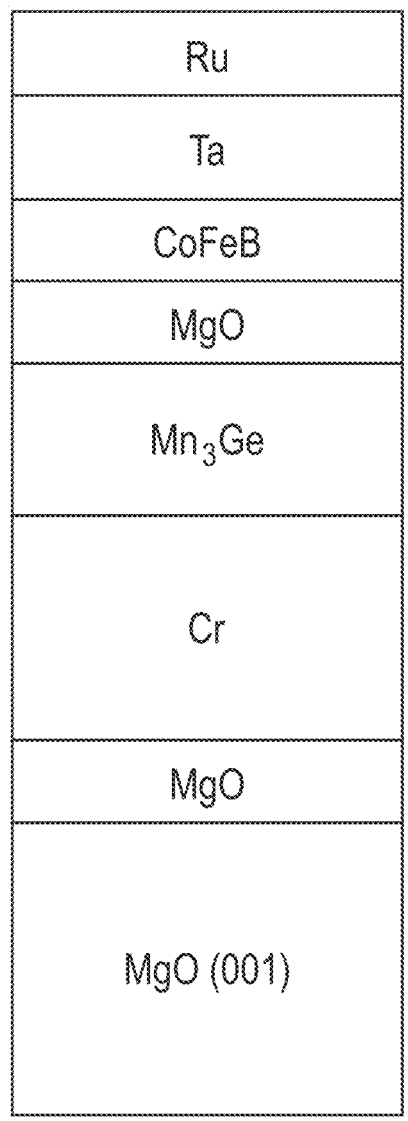

The uniaxial anisotropy constant K$_U$ is shown in the bottom panel of FIG. 3C (empty squares) as a function of Mn$_3$Ge thickness. K$_U$ monotonically increases by depositing thicker films onto the TaN diffusion barrier, which is due to the increase of magnetization with the Mn$_3$Ge thickness. K$_U$ was estimated from the relation K$_U$=H$_{eff}$·M$_S$/2+2πM$_S^2$ (H$_{eff}$ being the effective magnetic field and M$_S$ the saturation magnetization), in which the first term stands for the effective magnetic anisotropy, and the second one relates to the shape anisotropy arising from the sample's lateral dimensions (note that H$_{eff}$=7T was considered as lower bound—see the description of FIG. 3C in the Brief Description of the Figures).

MTJ devices were fabricated using standard lithographic techniques from films whose structure was Si/250 Å SiO$_2$/200 Å TaN/200 Å IrMn$_3$/10-20 Å TaN/300 Å Mn$_3$Ge (3-step process)/8-28 Å rf-MgO/10-15 Å CoFeB/50 Å Ta/50 Å Ru. Before patterning, these films were post-annealed at 350° C. for 60 minutes in a high-vacuum chamber with an applied magnetic field of 1T directed out of the plane of the samples. Devices with sizes of 1×2 μm$^2$ and ~30 nm in diameter were fabricated by optical lithography and e-beam lithography, respectively. Only the free layer was patterned to define the junction size—the reference layer was not patterned. The reference layer was formed from the Mn$_3$Ge Heusler compound, and the free layer was formed from an ultrathin layer of CoFeB with a composition of 20:60:20.

Figure 4A:
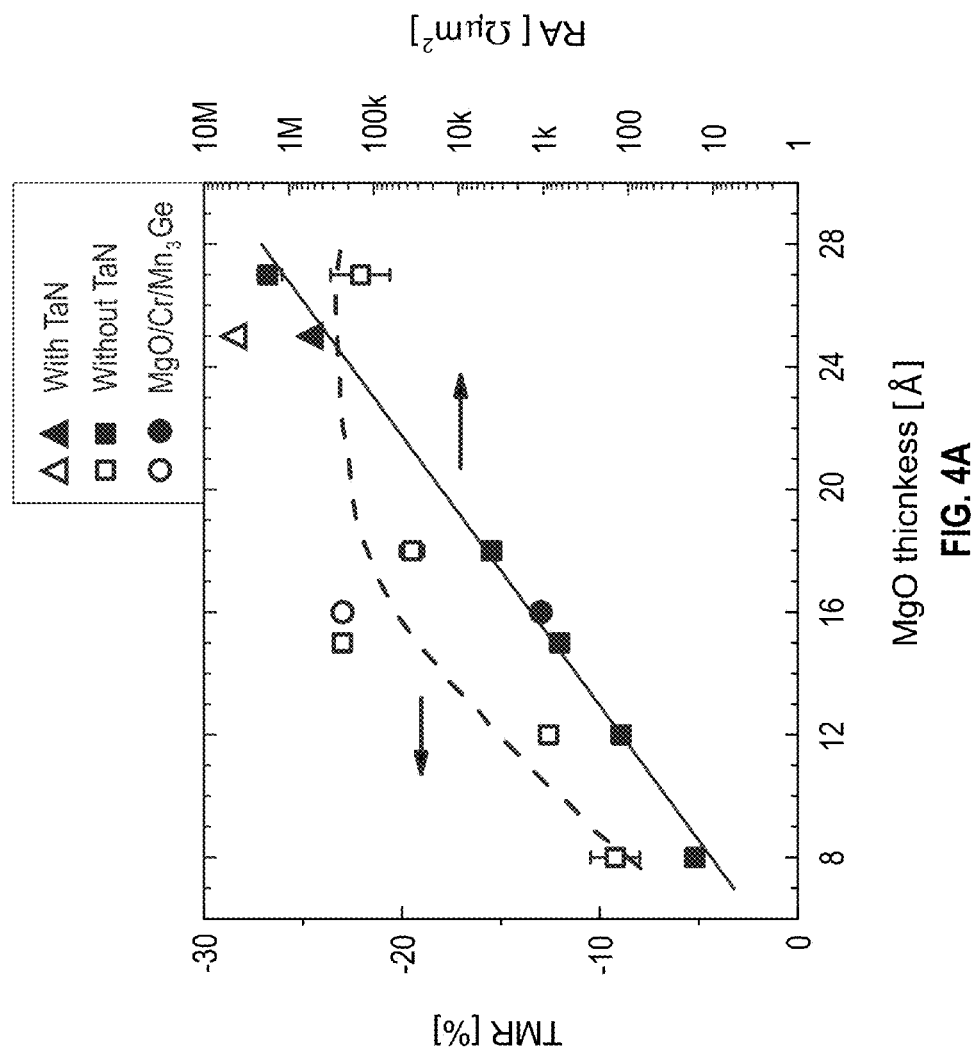
Figure 4B:
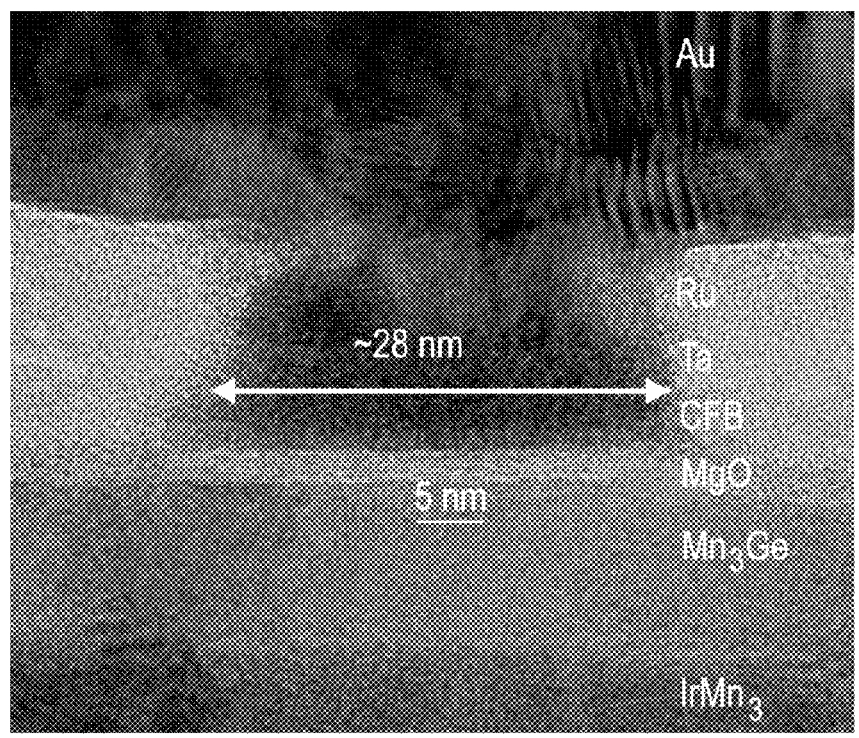
FIG. 4B HRTEM image of a Mn$_3$Ge-based device with ~27 nm junction size, patterned by e-beam lithography.
Figure 4C:
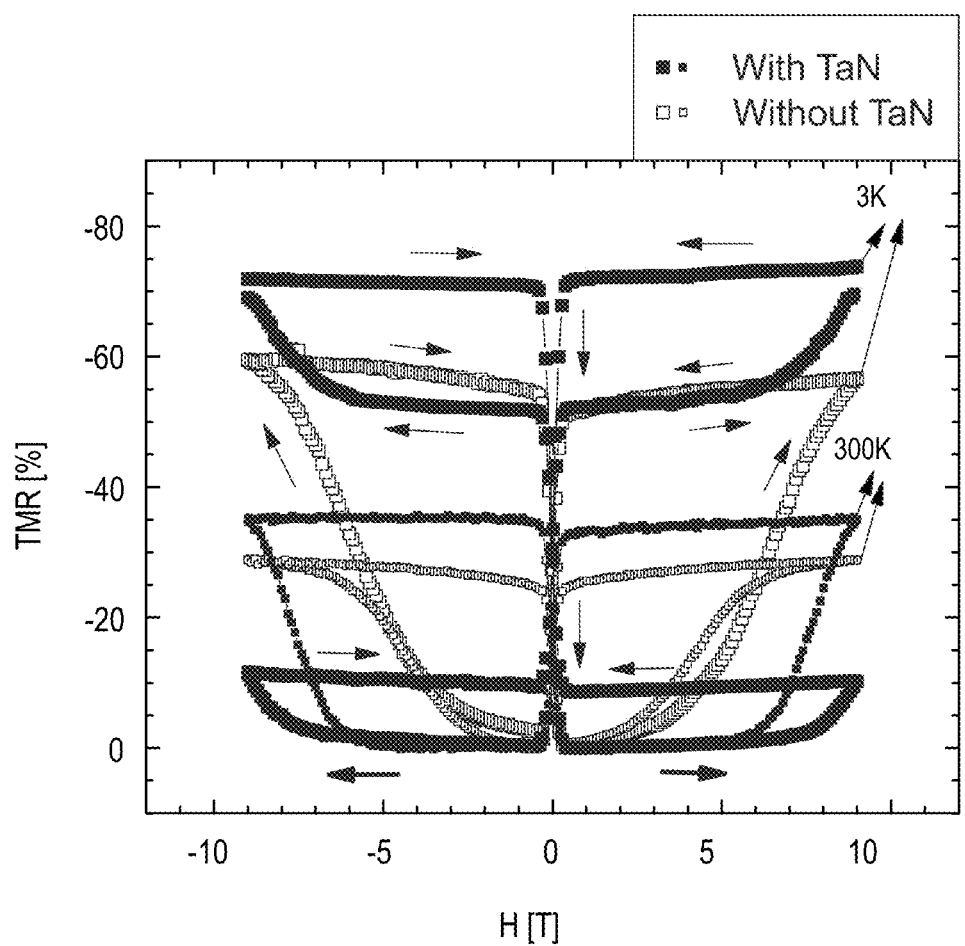

FIG. 4C shows the tunnel magnetoresistance (TMR) of the patterned MTJ devices versus applied perpendicular magnetic field measured at 300 K (smaller squares) and 3K (larger squares) for a 1×2 μm$^2$ MTJ device with a TaN diffusion barrier (solid squares; the MgO barrier was 25 Å thick) and without a TaN diffusion barrier (open squares; the MgO barrier was 27 Å thick). At both these temperatures very high applied magnetic fields (±9 T) are needed to align the moments of the Heusler and CoFeB layers parallel to each other (P state) because of the giant uniaxial anisotropy of the Mn$_3$Ge reference layer. In the P state the junction resistance is high and switches to a low resistance close to zero field when the CoFeB free layer moment switches its direction to be in the anti-parallel configuration (AP state). Thus the tunneling magnetoresistance (TMR) determined using the formula [(R$_P$−R$_{AP}$)/R$_{AP}$]×100 is negative with values of ~−35% at 300 K and ~−74% at 3K (R$_P$ and R$_{AP}$ being the junction resistances in the P and AP states, respectively). This negative TMR is indicative of negative spin polarization of the Mn$_3$Ge layer. This is the highest reported TMR to date obtained from perpendicularly-magnetized magnetic tunnel junction with a tetragonal Heusler alloy.

Figure 4D:
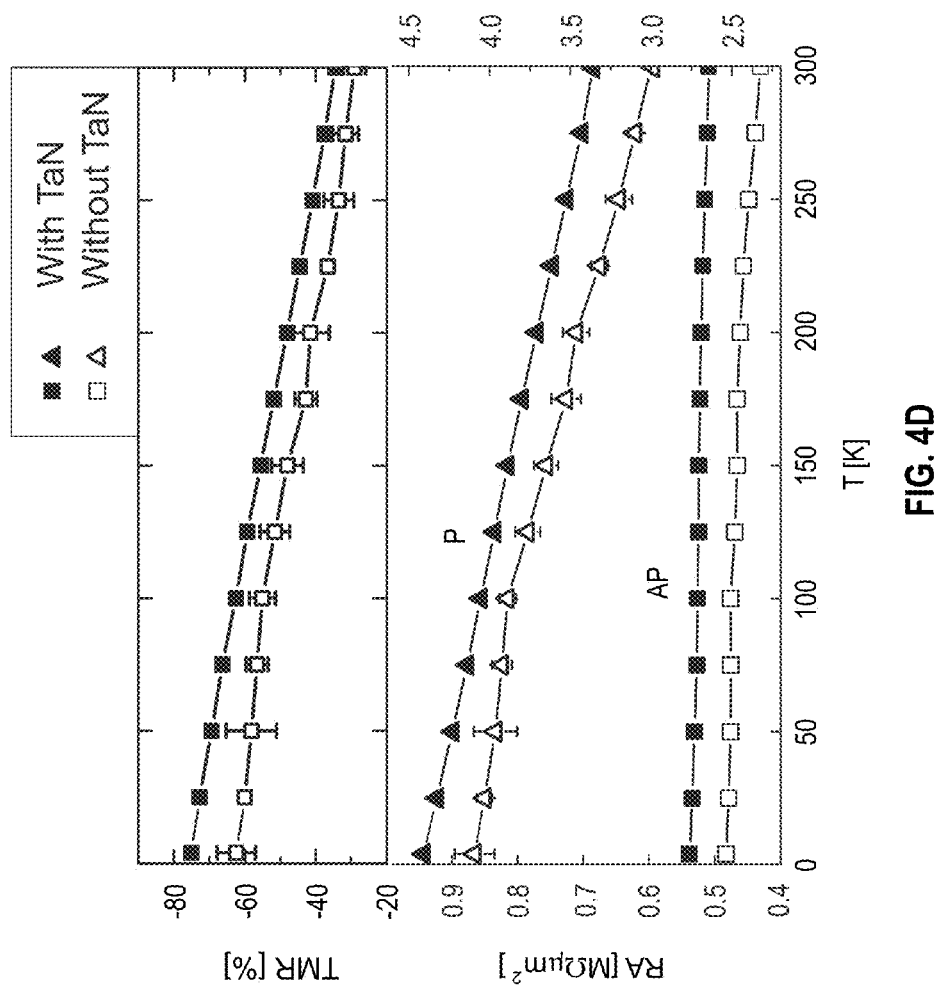
FIG. 4D Temperature dependence of R$_P$ and R$_{AP}$ (bottom panel) and TMR (top panel) for TaN/IrMn$_3$ and TaN/IrMn$_3$/TaN.

For the same device, the TMR (FIG. 4D, top panel) and the resistances in the P and AP states (FIG. 4D, bottom panel) were measured while cooling the device from 300 K to 3K. R$_{AP}$ barely changed, while R$_P$ increased monotonically as T decreased, resulting in higher TMR at low temperatures (see the bottom panel of FIG. 4D).

The dependence of the resistance-area product R$_{AP}$A (solid symbols) and TMR (open symbols) of MTJs on the tunnel barrier thickness measured at RT is averaged over >20 devices and summarized in FIG. 4A. (Note that the TMR values in FIG. 4A are smaller than those shown in FIG. 4C: In FIG. 4A, for fast evaluation of the TMR, R$_{AP}$ and R$_P$ values were respectively measured at +0.3T and −0.3T, instead of sweeping the magnetic field over the range ±9T.) R$_{AP}$ A increases exponentially with barrier thickness (A=area of device).

A cross-sectional high-resolution transmission electron microscopy (HRTEM) image of a device with the structure Si/250 Å SiO$_2$/200 Å TaN/200 Å IrMn$_3$/300 Å Mn$_3$Ge (3-step process)/15 Å rf-MgO/15 Å Co$_{20}$Fe$_{60}$B$_{20}$/50 Å Ta/50 Å Ru patterned by e-beam lithography is illustrated in FIG. 4B. The multilayered stack was etched by Ar milling down to the MgO tunnel barrier, giving the CoFeB free layer the desired size (here the device width is ~27 nm); after that, the lateral sides of the junction were filled with Al$_2$O$_3$ (bright and amorphous layer in the image) to isolate the junction from the top 50 Å Ru/650 Å Au contact, deposited in-situ by IBD.

Although the preferred materials for the underlayers that favor (001) textured Heusler thin films are TaN/IrMn$_3$ and TaN/IrMn$_3$/TaN, TaN may be substituted with other metallic nitrides that give rise to smooth surfaces. These include NbN (lattice constant a=4.36 Å), TiN (a=4.24 Å) and ScN (a=4.50 Å). IrMn$_3$ may be replaced with other similar materials that have the same structure as the AuCu$_3$ family of compounds. These include especially Mn-based compounds that include Mn$_3$Rh (a=3.81 Å) and Mn$_3$Os, which are particularly suitable for the growth of Mn based Heuslers including Mn$_3$Ge and Mn$_3$Ga. Other materials that may replace IrMn$_3$ include: AuCu$_3$ (a=3.74 Å), Ag$_3$Pt (a=3.88 Å), Mn$_3$Pt (a=3.87 Å), Fe$_3$Pt (a=3.73 Å), FePt$_3$ (a=3.87 Å), HfIr$_3$ (a=3.93 Å).

Note that the elemental composition of the underlayers and Heusler compounds is the nominal composition. This was measured by Rutherford backscattering (RBS) which is accurate to approximately ±1 atomic percent. The properties of the Heusler compounds are typically sensitive to the elemental composition, as well as the chemical ordering of the constituent elements and any impurities. For the IrMn$_3$ underlayer, the composition can be varied over a wide atomic range but preferably the ratio of Ir:Mn is within ±10% of the nominal ratio 1:3 or, less preferably, ±20% of the nominal ratio 1:3.

The preferred compositions disclosed herein are ideally pure with little or no impurities. In practice, however, deviations from the ideal case may be tolerated. The level of impurities is preferably less than 1 atomic percent, although an impurity level of up to 10 atomic percent may be tolerated.

REFERENCES

1. Felser, C., Fecher, G. H. & Balke, B. Spintronics: A Challenge for Materials Science and Solid-State Chemistry. *Angew. Chem. Int. Ed.* 46, 668-699, (2007).
2. *Pearson's Handbook of Crystallographic Data for Intermetallic Phases.* 2nd edn, (2009).
3. Li, M., Jiang, X., Samant, M. G., Felser, C. & Parkin, S. S. P. Strong dependence of the tetragonal $Mn_{2.1}Ga$ thin film crystallization temperature window on seed layer. *Appl. Phys. Lett.* 103, 032410, (2013).

The invention claimed is:

1. A device, comprising:
    a tetragonal Heusler of the form $Mn_{1+c}X$, wherein X includes an element selected from the group consisting of Ge and Ga, and wherein $0 \leq c \leq 3$; and
    a substrate oriented in the direction (001) and of the form $YMn_{1+d}$, wherein Y includes an element selected from the group consisting of Ir and Pt, and $0 \leq d \leq 4$, wherein the tetragonal Heusler and the substrate are in proximity with each other, thereby allowing spin-polarized current to pass from one through the other.

2. The device of claim 1, wherein X is Ge and Y is Ir.

3. The device of claim 1, further comprising a tunnel barrier in contact with the tetragonal Heusler.

4. The device of claim 3, wherein the tunnel barrier is MgO.

5. The device of claim 1, wherein a TaN layer is between and contacts both the tetragonal Heusler and the substrate.

6. The device of claim 1, wherein the tetragonal Heusler is of the form $Mn_3Ge$, and the substrate is of the form $IrMn_3$.

7. The device of claim 1, wherein the magnetization of the Heusler compound is perpendicularly oriented to the film plane.

8. The device of claim 7, wherein the thickness of the Heusler compound is between 10 and 500 angstroms.

9. The device of claim 1, wherein a TaN layer is underneath and in contact with the substrate.

10. A device, comprising:
    a first electrode;
    a magnetic free layer in contact with the first electrode;
    a tunnel barrier underlying the free magnetic layer;
    a magnetic reference layer underlying the tunnel barrier, wherein the magnetic reference layer includes a tetragonal Heusler of the form $Mn_{1+c}X$, X includes an element selected from the group consisting of Ge and Ga, and $0 \leq c \leq 3$; and
    a second electrode underlying the magnetic reference layer, the second electrode including a substrate oriented in the direction (001) and of the form $YMn_{1+d}$, wherein Y includes an element selected from the group consisting of Ir and Pt, and $0 \leq d \leq 4$, wherein current passing through the first electrode and the second electrode passes through the magnetic free layer, the tunnel barrier, and the magnetic reference layer.

11. The device of claim 10, wherein X is Ge and Y is Ir.

12. The device of claim 10, further comprising a tunnel barrier in contact with the tetragonal Heusler.

13. The device of claim 10, wherein a TaN layer is between and contacts both the tetragonal Heusler and the substrate.

14. The device of claim 10, wherein the tetragonal Heusler is of the form $Mn_3Ge$, and the substrate is of the form $IrMn_3$.

15. The device of claim 10, wherein a TaN layer is underneath and in contact with the substrate.

16. A method of using the device of claim 10, comprising:
    applying voltage across the first electrode and the second electrode, thereby inducing current to flow through the magnetic layers and the tunnel barrier.

17. The method of claim 16, wherein the orientation of the free magnetic layer is changed as a result of spin transfer torque from the current.

18. The method of claim 16, wherein the device is one of a plurality of magnetic tunnel junction devices that together form a magnetic random access memory (MRAM), each of the tunnel junction devices including a free layer having a respective orientation, the method further comprising:
    reading information out of the MRAM by detecting the orientation of the free layers.

\* \* \* \* \*